United States Patent
Passerini et al.

(10) Patent No.: US 11,430,519 B2
(45) Date of Patent: Aug. 30, 2022

(54) SWITCHING ARCHITECTURE FOR A NAND FLASH MEMORY DEVICE AND A HIGH VOLTAGE SWITCH CIRCUIT

(71) Applicant: SK hynix Inc., Icheon-si Gyeonggi-do (KR)

(72) Inventors: Marco Passerini, Agrate Brianza (IT); Giulio Maria Iadicicco, Agrate Brianza (IT); Yong Tae Kim, Icheon-si Gyeonggi-do (KR); Moon Soo Sung, Icheon-si Gyeonggi-do (KR); Dario Melchionni, Agrate Brianza (IT); Miriam Sangalli, Agrate Brianza (IT)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/196,713

(22) Filed: Mar. 9, 2021

(65) Prior Publication Data

US 2021/0287747 A1   Sep. 16, 2021

(30) Foreign Application Priority Data

Mar. 10, 2020   (IT) .................. 102020000005104

(51) Int. Cl.
*G11C 16/04*   (2006.01)
*G11C 16/16*   (2006.01)
*G11C 16/08*   (2006.01)

(52) U.S. Cl.
CPC .......... *G11C 16/0483* (2013.01); *G11C 16/08* (2013.01)

(58) Field of Classification Search
CPC ..... G11C 16/0483; G11C 16/08; G11C 16/10; G11C 16/12; G11C 16/04; G11C 16/06; G11C 16/16; G11C 16/30
See application file for complete search history.

(56) References Cited

U.S. PATENT DOCUMENTS

| | | | | |
|---|---|---|---|---|
| 8,520,445 | B2* | 8/2013 | Koo | G11C 17/18 365/185.13 |
| 8,867,298 | B2* | 10/2014 | Park | G11C 16/24 365/230.03 |
| 2005/0254299 | A1 | 11/2005 | Tanuma et al. | |
| 2006/0044877 | A1 | 3/2006 | Kato | |

(Continued)

FOREIGN PATENT DOCUMENTS

| KR | 100882205 B1 | 2/2009 |
|---|---|---|
| KR | 1020120119334 A | 10/2012 |

(Continued)

*Primary Examiner* — Hien N Nguyen
(74) *Attorney, Agent, or Firm* — William Park & Associates Ltd.

(57) ABSTRACT

A switching architecture provides input voltage signals from input voltage lines to a plurality of global word lines connected to word lines of a memory array in a memory device. The switching architecture includes a first switching block receiving a first set of positive voltages used to bias unselected word lines and being connected to a first output line providing a first output bias voltage, and a second switching block receiving a second set of positive voltages and a third set of negative voltages used to bias selected word lines and being connected to a second output line providing a second output bias voltage. A plurality of final switches are input connected to the first and second output lines and are output connected to a respective global word line.

20 Claims, 12 Drawing Sheets

(56) References Cited

U.S. PATENT DOCUMENTS

| | | | |
|---|---|---|---|
| 2012/0008391 A1 | 1/2012 | Lee et al. | |
| 2012/0104232 A1* | 5/2012 | Hwang | H04N 5/369 250/208.1 |
| 2013/0070552 A1* | 3/2013 | Ryu | G11C 8/14 365/230.03 |
| 2013/0107627 A1* | 5/2013 | Toyama | G11C 16/08 365/185.11 |
| 2017/0084339 A1* | 3/2017 | Son | G11C 16/08 |
| 2018/0082744 A1* | 3/2018 | Park | G11C 16/0483 |
| 2019/0267094 A1* | 8/2019 | Guo | G11C 16/14 |

FOREIGN PATENT DOCUMENTS

| | | |
|---|---|---|
| KR | 1020140095125 A | 8/2014 |
| KR | 1020150121288 A | 10/2015 |

* cited by examiner

SWITCHING ARCHITECTURE FOR A NAND FLASH MEMORY DEVICE AND A HIGH VOLTAGE SWITCH CIRCUIT

CROSS-REFERENCE TO RELATED APPLICATION

This application claims priority based upon Italian patent application No. 102020000005104, filed on Mar. 10, 2020, the disclosure of which is hereby incorporated in its entirety by reference herein.

BACKGROUND

Field of Invention

The present disclosure relates to a switching architecture for a NAND flash memory device and a high voltage switch circuit.

Description of Related Art

As it is well known, currently memory devices are more and more important and necessary parts of a lot of electronic systems. In order to make an electronic system more compact and faster, optimization of the memory architecture included therein in terms of area, power and speed is sought.

A memory architecture essentially may include individual memory cells arranged in an array of horizontal rows and vertical columns, each memory cell being usually able to store one or more bits of binary information. Considering an array that includes M rows of memory cells coupled to word lines, and N columns of memory cells coupled to bit lines, the total number of memory cells is M×N.

To access a particular memory cell, i.e., a particular data bit in a memory array, a word line WL and a bit line BL should be activated (or selected) according to the address coming from the outside of the memory architecture. The row and column selection operations are accomplished by row and column decoders, respectively, which are located in the memory architecture. The row and column decoders select a memory cell for reading or programming. Namely, a row decoder circuit selects one out of M word lines according to a row address, while the column decoder circuit selects one out of N bit lines according to a column address.

The performance of the row and column decoders influences the memory speed as a whole, being sensitive to the volume of data especially in high performance memory devices.

Among various types of memory devices, a NAND flash memory device is increasingly used as a high capacity data storage media. By trapping electrons in a floating gate or a charge trap layer of a memory cell, the NAND flash memory is programmed to store information. The programming operation is performed by driving a strong positive voltage on the control gate to force a current to flow from the channel through the floating gate or the charge trap layer to the control gate, which is the so called "Fowler Nordheim Tunneling" effect. A control gate terminal is connected to a word-line of the NAND flash memory, and a voltage is provided to the control gate terminal through the word-line.

The NAND flash memory devices usually include at least a switch core being used to pass a positive high voltage or/and a negative voltage to the memory array. More particularly, high positive voltages are applied to word lines WL during a program operation, and positive or negative voltages are applied to word lines WL during a read operation depending on the page to be read.

A switch core for the NAND flash memory device is shown in FIG. 1.

The switch core 100 may include a switching architecture VGWL_DEC 110 that connects one among a plurality of high or low voltage lines V1, V2, . . . , VN to each of global word lines VGWL1, VGWL2, . . . , VGWLy.

More particularly, the number y of global word lines VGWL usually corresponds to the number of memory cells forming a string of the NAND flash memory array and can be equal to 64, 128, or more depending on technology.

Also, the number N of high or low voltage lines is related to technology and design and it depends on extent of flexibility needed in biasing the NAND string during read, program or erase operation.

Finally, one or more high or low voltage lines may be negative.

The global word lines VGWL are connected to a plurality of high voltage final switches located in a corresponding plurality of switch blocks BLOCK0 . . . BLOCKj of a row decoder block XDEC 120, in turn connected to the word lines WL.

The global word lines VGWL are usually referred to as global word lines VGWL as they may be connected to any NAND string by XDEC block 120; in this case, word lines WL are usually referred to as local word lines WL, as they are separated lines for each NAND string.

As shown in FIG. 2, the switching architecture VGWL_DEC is usually a hierarchical architecture that is used to reduce the number of high voltage switch circuits needed to carry input voltage signals from input voltage lines to each global word line VGWL.

According to the exemplary embodiment of FIG. 2, three sets of input voltage lines, indicated as $V^{\#}i$, $V^{\$}j$ and $V*o$, are to be passed onto global word lines VGWL by the switching architecture 200. More particularly, the three sets of input voltage lines include:

a first set $V^{\#}1, \ldots V^{\#}i, \ldots V^{\#}N$ of positive voltages used to bias unselected global word lines VGWL;

a second set $V^{\$}1, \ldots V^{\$}j, \ldots V^{\$}M$ of positive voltages used to bias selected global word lines VGWL; and a third set $V*1, \ldots V*k, \ldots V*O$ of negative voltages used to bias selected global word lines VGWL.

In this way, each one of the global word lines VGWL0, . . . VGWL1, . . . VGWLh, . . . VGWLy may be connected, according to needs, to one of the following output lines:

a first output line UNSEL providing a first output bias voltage VUNSEL, being used to bias unselected global word lines VGWL;

a second output line SEL providing a second output bias voltage VSEL, being used to bias selected global word lines VGWL with a positive voltage value; and a third output line NEG providing a third output bias voltage VNEG, being used to bias selected global word lines VGWL with a negative voltage value.

More particularly, the third output bias voltage VNEG should be routed to each global word line VGWL and only one or few global word lines VGWL may be connected to the third output line NEG at the same time.

The switching architecture 200 may include:

a first switching block POS1 SW 210 receiving the first set $V^{\#}1, \ldots V^{\#}i, \ldots V^{\#}N$ of positive voltages and being connected to the first output line UNSEL;

a second switching block POS2 SW 220 receiving the second set $V^S1, \ldots V^Sj, \ldots V^SM$ of positive voltages and being connected to the second output line SEL; and a third switching block NEG SW 230 receiving the third set $V*1, \ldots V*k, \ldots V*O$ of negative voltages and being connected to the third output line NEG.

The output lines UNSEL, SEL and NEG are also connected to a plurality of final switches, usually indicated as final global word lines switches GWLSW 240, each connected to a respective global word line VGWL0, . . . VGWL1, . . . VGWLh, . . . VGWLy.

More particularly, as shown in FIG. 3, each final global word lines switch 300 may include a plurality of high voltage switch circuits inserted between a couple of supply voltage lines and having an input terminal receiving an enabling signal and an output terminal connected to a respective pass transistor.

More particularly, according to the exemplary embodiment shown in FIG. 3, the final global word lines switch 300 may include a first high voltage switch circuit HVSW_P 310, a second high voltage switch circuit HVSW_P 320, a third high voltage switch circuit HVSW_N 330, and a fourth high voltage switch circuit HVSW_N 340. The first high voltage switch circuit HVSW_P 310 may be inserted between a positive voltage supply VSUPPLY_P and ground GND and may have a first input terminal receiving a first enabling signal EN1 and a first output terminal OUT1 connected to the control or gate terminal of a first pass transistor M1, which is in turn inserted between a first selection line SEL receiving a first selection voltage VSEL and an internal node VGWL_INT. The second high voltage switch circuit HVSW_P 320 may be inserted between the positive voltage supply VSUPPLY_P and ground GND and may have a second input terminal receiving a second enabling signal EN2 and a second output terminal OUT2 connected to the control or gate terminal of a second pass transistor M2, which is in turn inserted between a second selection line UNSEL receiving a second selection voltage VUNSEL and the internal node VGWL_INT. The third high voltage switch circuit HVSW_N 330 may be inserted between the positive voltage supply VSUPPLY_P and a negative voltage supply VSUPPLY_N and may have a third input terminal receiving a third enabling signal ENPOS and a third output terminal OUT3 connected to the control or gate terminal of a third pass transistor M3, which is in turn inserted between the internal node VGWL_INT and an output terminal OUTGWL of final global word lines switch 300 connected to a global word line VGWL. The third pass transistor M3 also may have a bulk terminal receiving the negative voltage supply VSUPPLY_N. The fourth high voltage switch circuit HVSW_N 340 may be inserted between the positive voltage supply VSUPPLY_P and the negative voltage supply VSUPPLY_N and may have a fourth input terminal receiving a fourth enabling signal ENNEG and a fourth output terminal OUT4 connected to the control or gate terminal of a fourth pass transistor M4, which is in turn inserted between a negative voltage VNEG and the output terminal OUTGWL. The fourth pass transistor M4 may also have a bulk terminal receiving the negative voltage supply VSUPPLY_N.

Suitably, the first pass transistor M1 and the second pass transistor M2 are non-triple well NMOS transistors because they have to connect only positive voltages (VSEL or VUNSEL) to the internal node VGWL_INT.

The third high voltage switch circuit HVSW_N 330 and the fourth high voltage switch circuit HVSW_N 340 are instead supplied with the positive voltage supply VSUPPLY_P and the negative voltage supply VSUPPLY_N. Thus, the third pass transistor M3 and the fourth pass transistor M4 are triple well NMOS transistors able to sustain either positive or negative voltages, in particular a positive voltage value at the internal node VGWL_INT and the negative voltage VNEG to the output terminal OUTGWL and then the global word line VGWL.

A high voltage switch circuit is schematically shown in FIG. 4A.

The high voltage switch circuit 400 may include a first depletion NMOS transistor MND1 and a second depletion NMOS transistor MND2 parallel inserted between the positive voltage supply VSUPPLY_P and an internal node INT. The first depletion NMOS transistor MND1 has a control or gate terminal connected to an output terminal OUT of the high voltage switch circuit 400. The second depletion NMOS transistor MND2 has a control or gate terminal receiving a first enabling signal EN.

The high voltage switch circuit 400 further may include a PMOS transistor MP1 inserted between the internal node INT and the output terminal OUT. In addition, the high voltage switch 400 may include an NMOS transistor MN1 inserted between the output terminal OUT and the negative voltage supply VSUPPLY_N. The PMOS transistor MP1 and the NMOS transistor MN1 may have respective control or gate terminals connected to a second enabling signal EN_b and bulk terminals connected to the internal node INT and to the negative voltage supply VSUPPLY_N, respectively.

The NMOS transistor MN1 may be an NMOS triple-well transistor.

Moreover, as schematically indicated in FIG. 4B, the first and second enabling signals EN and EN_b may be set alternatively equal to a supply voltage value VCC and ground GND by a logic gate 450.

The high voltage switch circuit 400 may be used to switch between the positive voltage supply VSUPPLY_P and the negative voltage supply VSUPPLY_N, because such a commutation of the voltage value at the output terminal OUT may cause problems due to the capacitances connected thereto.

In particular, during a High→Low commutation, when high voltage switch circuit 400 toggles output terminal from high state (VSUPPLY_P) to low state (VSUPPLY_N) the NMOS transistor MN1 drives a considerable amount of current for a certain time. The amount of this current depends on parasitic capacitance connected on the output terminal OUT and on the size of the first depletion NMOS transistor MND1 and the PMOS transistor MP1 that form an upper part of the high voltage switch circuit 400.

In fact, during the initial part of the High→Low commutation, the high voltage switch circuit 400 may have both pull-up part (including first depletion NMOS transistor MND1 and PMOS transistor MP1) and pull-down part (NMOS transistor MN1) simultaneously on.

For this reason, negative voltage supply VSUPPLY_N node may experience bouncing. In particular, if many switches are toggling simultaneously, bouncing may increase.

Even if in the NAND flash memory device, only one or few of the final global word lines switches GWLSW connect the negative voltage VNEG to a respective global word line VGWL, while all other (i.e. the majority of) final global word lines switches GWLSW connect positive voltages to a respective global word line VGWL, simultaneous switching of more than one high voltage switch circuit HVSW_N between the positive voltage supply VSUPPLY_P and the negative voltage supply VSUPPLY_N may cause problems and working malfunctioning, due to the important voltage swing and the parasitic capacitances connected to the output terminals of the switches.

Moreover, a recent trend in the NAND flash memory devices field is to increase the number of word lines WL in a string in order to increase the number of bits per area. The increased number of word lines WL forces the number of the high voltage switch circuits to increase too. With a concomitant unwanted increase of the area occupation of the NAND flash memory devices, the market requirements to the contrary lead towards more and more miniaturized devices.

SUMMARY

Embodiments of the invention are directed to an improved switching architecture and to a high voltage switch circuit located therein.

The aim of the proposed switching architecture is to reduce the area per number of high voltage switch circuits located therein and to increase the robustness of the architecture as a whole when several switches toggle simultaneously.

In an embodiment of the invention, a switching architecture for providing input voltage signals from input voltage lines to a plurality of global word lines connected to word lines of a memory array in a memory device may include two switching blocks and a plurality of final switches.

The first switching block may receive a first set of positive voltages used to bias unselected word lines and may be connected to a first output line to provide a first output bias voltage.

The second switching block may receive a second set of positive voltages and a third set of negative voltages used to bias selected word lines and may be connected to a second output line to provide a second output bias voltage.

The plurality of final switches may be input connected to the first and second output lines and may be output connected to a respective global word line.

According to another embodiment of the invention, a high voltage switch circuit for a final switch of a switching architecture may provide input voltage signals from input voltage lines to a plurality of global word lines connected to global word lines in a memory device. The high voltage switch circuit may be inserted between a positive voltage supply and a negative voltage supply. The high voltage switch circuit may include a first depletion NMOS transistor and a second depletion NMOS transistor, a PMOS transistor, an NMOS transistor, and a cascode block.

The first depletion NMOS transistor and the second depletion NMOS transistor may be parallel inserted between the positive voltage supply and a first internal node. The first depletion NMOS transistor may have a control terminal connected to the output terminal of the high voltage switch circuit and the second depletion NMOS transistor may have a control terminal receiving a first shifted enabling signal.

The PMOS transistor may be inserted between the first internal node and the output terminal and may have a control terminal receiving a second shifted enabling signal.

The NMOS transistor may be inserted between a second internal node and the negative voltage supply and may have a control terminal receiving a third shifted enabling signal.

The cascode block may be inserted between the output terminal and the second internal node, may include a further NMOS transistor inserted between the output terminal and the second internal node, and may have a control terminal receiving the second shifted enabling signal and a bulk terminal connected to the negative voltage supply.

According to another embodiment of the invention, a switching architecture for providing a global word line switch with a reduced area may include a voltage generation circuit and two switching circuits.

The voltage generation circuit may generate a first positive voltage, a second positive voltage, and a negative voltage, respectively.

The first switching circuit may switch the first positive voltage to a plurality of global word line switches.

The second switching circuit may be configured as a single circuit, for switching the second positive voltage or the negative voltage to the plurality of global word line switches.

BRIEF DESCRIPTION OF THE DRAWINGS

The characteristics and advantages of the disclosure will be apparent from the following description of embodiments thereof given by way of indicative and non-limiting example with reference to the annexed drawings, in which.

DETAILED DESCRIPTION

Figure 1:
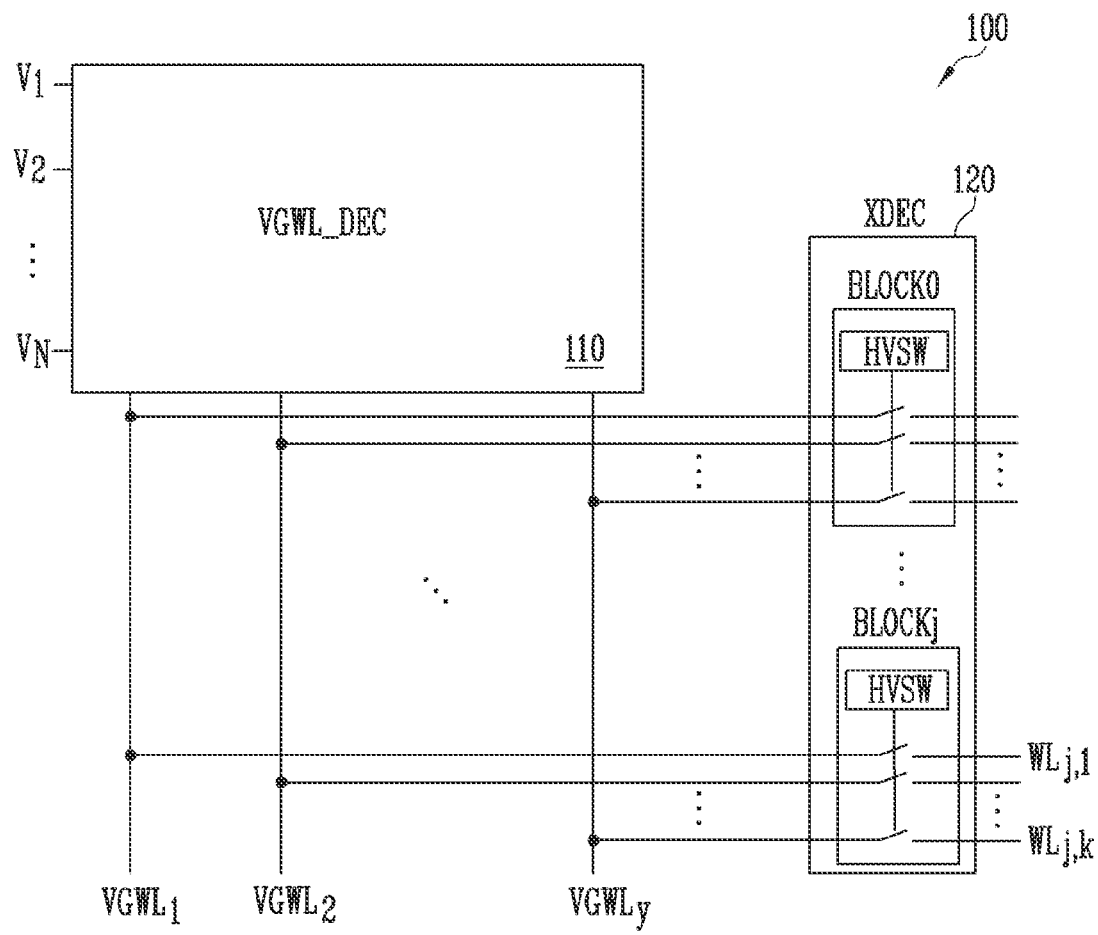
FIGS. 1 and 2 show a switch core for a NAND flash memory device and its switching architecture according to the prior art.
Figure 2:
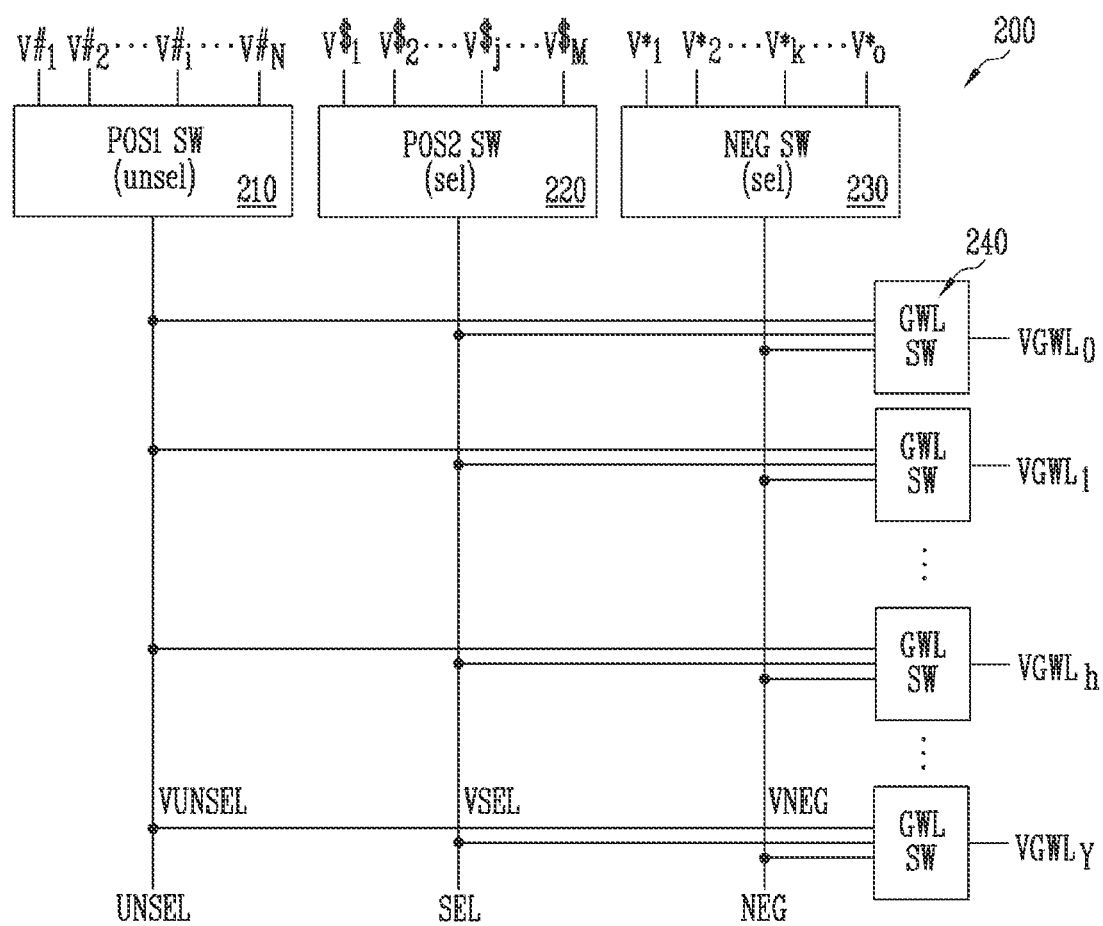
Figure 3:
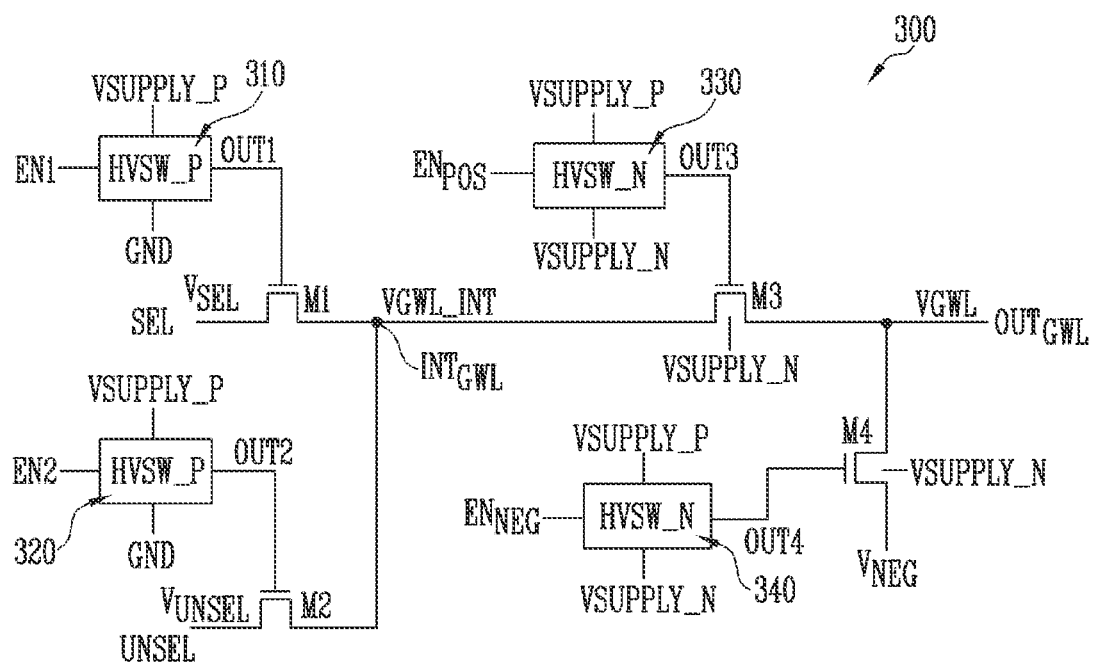
FIG. 3 shows a final global word lines switch for the switching architecture according to the prior art.
Figure 4A:
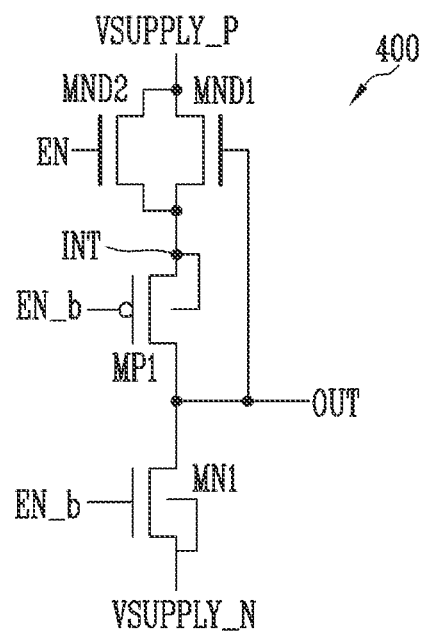
FIGS. 4A and 4B show a high voltage switch circuit for a final global word lines switch and a logic gate connected thereto, respectively, according to the prior art.
Figure 4B:
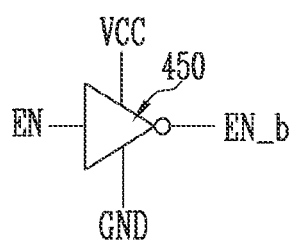

Exemplary embodiments of the present invention will be described in detail below with reference to the accompanying drawings. While the present invention is shown and described in connection with exemplary embodiments thereof, it will be apparent to those skilled in the art that various modifications may be made without departing from the spirit and scope of the invention. The terms and words used in the specification and claims should not be construed as their ordinary or dictionary sense. On the basis of the principle that the inventor may define the appropriate concept of a term in order to describe his/her own invention in the best way, it should be construed as a meaning and concept for complying with the technical idea of the present invention. In addition, detailed descriptions of constructions being well known in the art may be omitted to avoid unnecessarily obscuring the clarity of the present invention.

In the drawings, corresponding features are identified by the same reference numerals.

Figure 5:
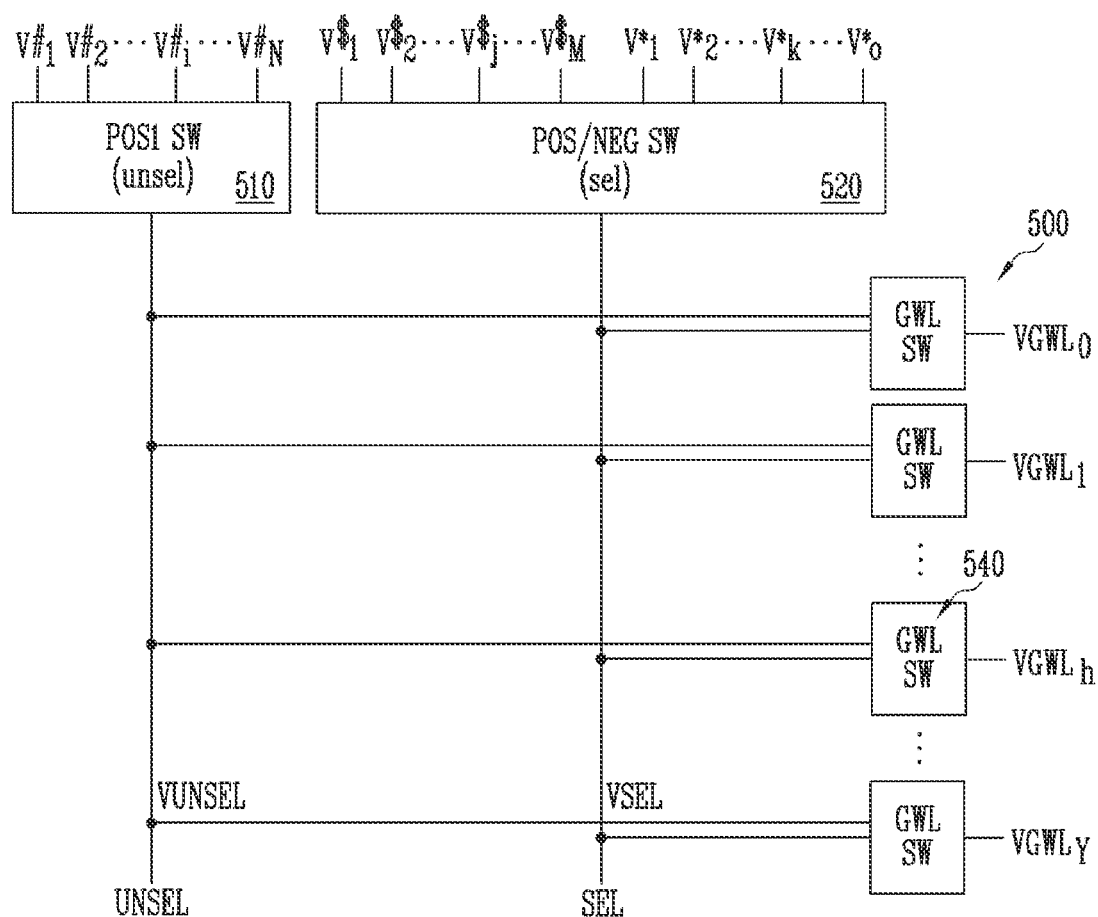
FIG. 5 shows a switching architecture according to an embodiment.

FIG. 5 schematically shows a switching architecture that connects one among a plurality of high or low voltage lines to each of a plurality of global word lines VGWL1, VGWL2, ..., VGWLy. In essence, the switching architecture provides input voltage signals from input voltage lines to each global word line. As explained above, global word lines VGWL are usually referred to as global word lines VGWL.

More particularly, the switching architecture 500 is included in a switch core for a NAND flash memory device. The number y of global word lines VGWL may correspond to the number of memory cells forming a string of an array of the NAND flash memory device.

According to the exemplary embodiment of FIG. 5, three sets of input voltage lines, indicated as $V^{\#}i$, $V^{\$}j$ and $V^{*}o$, are to be passed onto the global word lines VGWL0, . . . VGWL1, . . . VGWLh, . . . VGWLy.

In particular, the switching architecture 500 may include a first switching block POS1 SW 510 that receives the first set $V^{\#}1, \ldots V^{\#}i, \ldots V^{\#}N$ of positive voltages used to bias unselected word lines of the NAND flash memory device and may be connected to a first output line UNSEL to provide a first output bias voltage VUNSEL.

According to an embodiment, the switching architecture 500 further may include a second switching block POS/NEG SW 520 that receives a second set $V^{\$}1, \ldots V^{\$}j, \ldots V^{\$}M$ of positive voltages as well as a third set $V^{*}1, \ldots V^{*}k, \ldots V^{*}O$ of negative voltages used to bias selected word lines and may be connected to a second output line SEL to provide a second output bias voltage VSEL.

The first and second output lines UNSEL and SEL may be connected to a plurality of final switches, usually indicated as final global word lines switches GWLSW 540, so that each is connected to a respective global word line VGWL0, . . . VGWL1, . . . VGWLh, . . . VGWLy.

In this way, according to this embodiment, each final global word lines switch GWLSW 540 has a number of input voltages that have been reduced from three to two, with respect to the prior art solutions.

It should be remarked that, in this way, the area occupied by each final global word lines switch GWLSW 540 is thus reduced, and, consequently, the area occupied by the switching architecture 500 as a whole is reduced. The greatest part of the area occupation of the switching architecture 500 is thus tied to the final global word lines switches GWLSW 540 (corresponding to the last level of hierarchy of switches of the switching architecture), with their number equal to y, i.e., the number of the global word lines VGWL, continuingly increasing.

According to the embodiment shown in FIG. 5, the second switching block POS/NEG SW 520 may include high voltage switch circuits able to handle negative values, so that the third set $V^{*}1, \ldots V^{*}k, \ldots V^{*}O$ of negative voltages may share the second output line SEL with the second set $V^{\$}1, \ldots V^{\$}j, \ldots V^{\$}M$ of positive voltages.

Figure 6A:
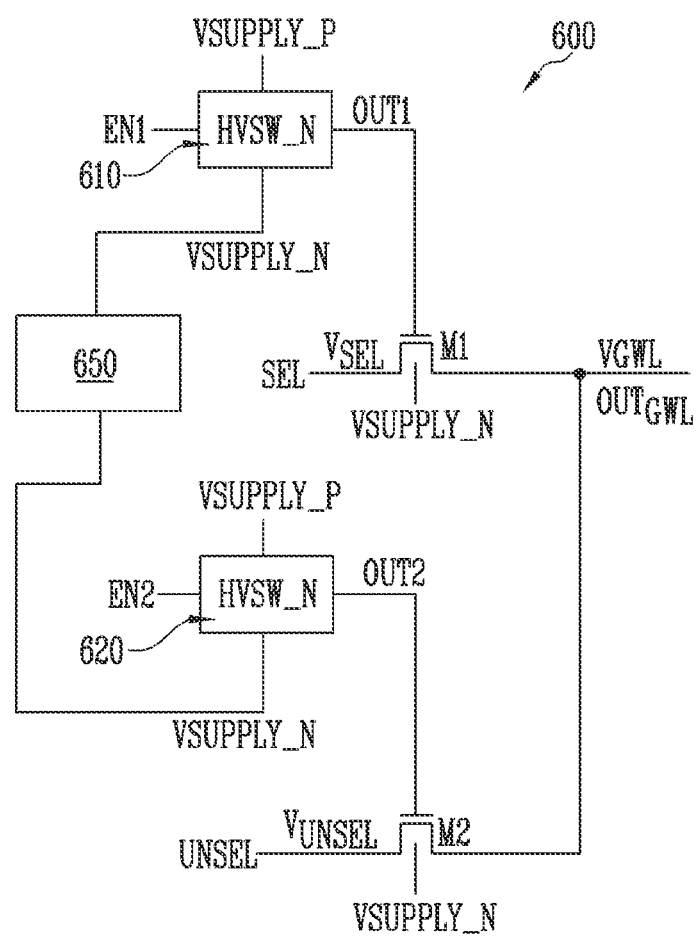
FIGS. 6A and 6B show final switches for the switching architecture according to an embodiment.

Moreover, as shown in FIG. 6A, each final global word lines switch 600 may include a plurality of high voltage switch circuits inserted between a couple of supply voltage lines, in particular a positive voltage supply VSUPPLY_P and a negative voltage supply VSUPPLY_N, and may have an input terminal receiving an enabling signal and an output terminal connected to a respective pass transistor, which is in turn connected to a global word line VGWL.

More particularly, according to the exemplary embodiment shown in FIG. 6A, the final global word lines switch 600 may include s first high voltage switch circuit HVSW_N 610 and a second high voltage switch circuit HVSW_N 620, The first high voltage switch circuit HVSW_N 610 may be inserted between the positive voltage supply VSUPPLY_P and the negative voltage supply VSUPPLY_N and may have a first input terminal receiving a first enabling signal EN1 and a first output terminal OUT1 connected to the control or gate terminal of a first pass transistor M1, which in turn may be inserted between the first selection line SEL receiving the first selection voltage VSEL and an output terminal OUTGWL of the final global word lines switch 600 connected to a global word line VGWL.

The second high voltage switch circuit HVSW_N 620 may be inserted between the positive voltage supply VSUPPLY_P and the negative voltage supply VSUPPLY_N and may have a second input terminal receiving a second enabling signal EN2 and a second output terminal OUT2 that is connected to the control or gate terminal of a second pass transistor M2, which in turn may be inserted between the second selection line UNSEL receiving the second selection voltage VUNSEL and the output terminal OUT-GWL that is connected to the global word line VGWL.

The first pass transistor M1 and second pass transistor M2 are triple well NMOS transistors, and thus are able to connect positive or negative voltage values to the output terminal OUTGWL and to the global word line VGWL. The first pass transistor M1 and second pass transistor M2 also have bulk terminals connected to the negative voltage supply VSUPPLY_N.

The switching architecture 500 of FIG. 5 further may include a selection block 650 that provides a negative voltage supply VSUPPLY_N to the first and second high voltage switch circuits 610 and 620 of all final global word line switches 600.

Figure 6B:
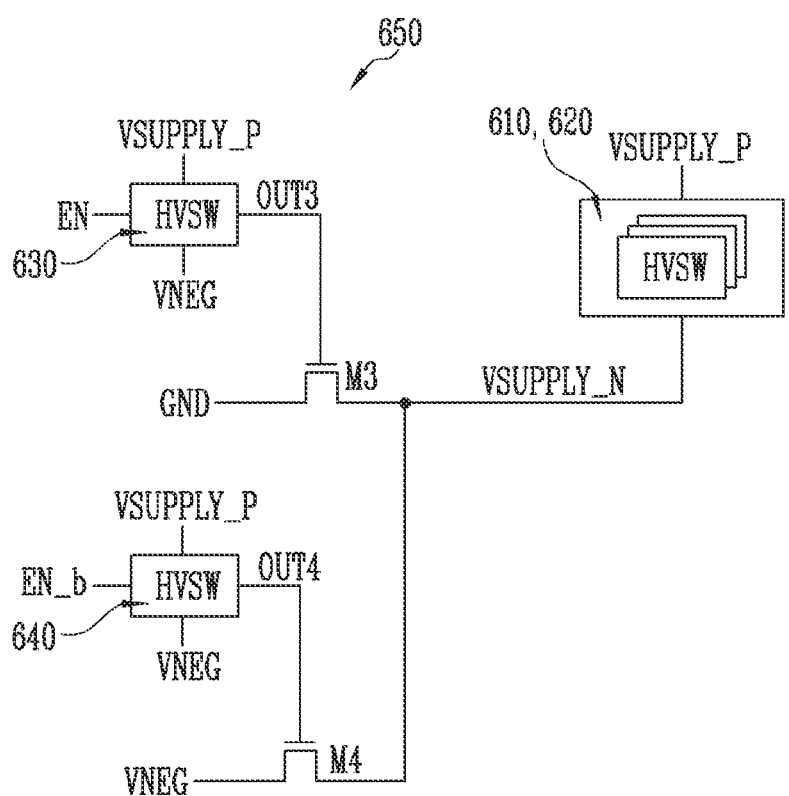

According to an embodiment shown in FIG. 6B, the selection block 650 in turn may include a third high voltage switch HVSW 630 and a fourth high voltage switch circuit 640.

The third high voltage switch circuit HVSW 630 may be inserted between the positive voltage supply VSUPPLY_P and a negative voltage VNEG and may have a third input terminal receiving a third enabling signal EN and a third output terminal OUT3 connected to the control or gate terminal of a third pass transistor M3, which in turn may be inserted between ground GND and the negative voltage supply VSUPPLY_N.

The fourth high voltage switch circuit HVSW 640 may be inserted between the positive voltage supply VSUPPLY_P and the negative voltage VNEG and may have a fourth input terminal receiving a fourth enabling signal EN_b and a fourth output terminal OUT4 connected to the control or gate terminal of a fourth pass transistor M4, which in turn may be inserted between the negative voltage VNEG and the negative voltage supply VSUPPLY_N.

The third and fourth additional enabling signals EN and EN_b may be set alternatively equal to a supply voltage value VCC and ground GND.

In this way, if negative voltage values have to be passed only during a selected operation or a selected time, the negative voltage supply VSUPPLY_N may be switched between ground GND (corresponding to the case when the high voltage switch circuits operate with positive voltages only) and the negative voltage VNEG (corresponding to the case when the high voltage switch circuits operate with negative voltages).

For example, considering the NAND Flash memory device, the selection block 650 may be able to provide a correct value for the negative voltage supply VSUPPLY_N in the different working phases of the device. In particular, during a program pulse phase, only positive voltages may be used to bias the memory cells so that then the negative voltage supply VSUPPLY_N is connected to ground GND. When, during a read phase, a selected word line WL may be biased at a negative voltage, negative voltage supply VSUPPLY_N may be connected to the negative voltage VNEG.

Figure 7A:
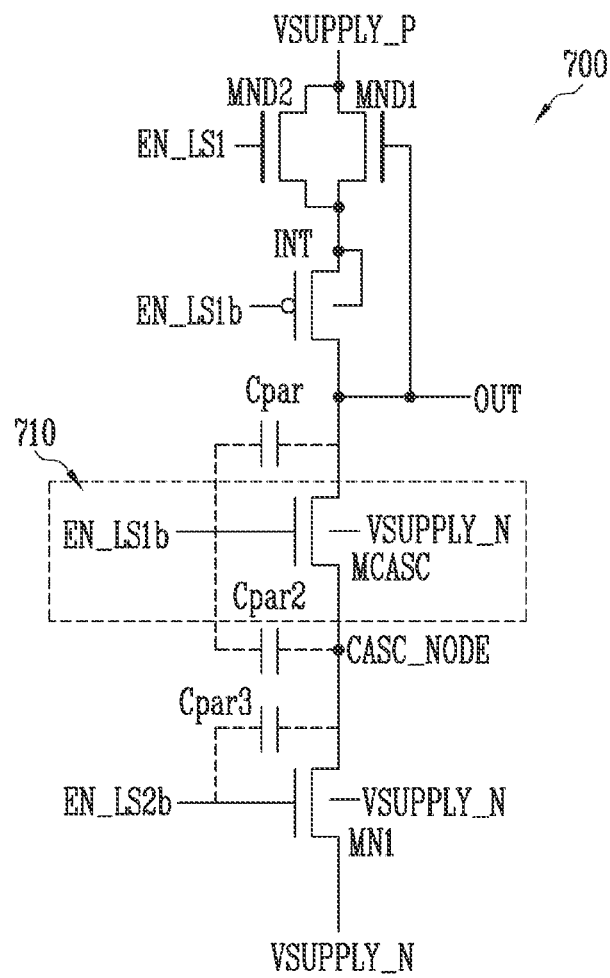
FIGS. 7A and 7B show a high voltage switch circuit and level shifters connected thereto, respectively, according to an embodiment.

A high voltage switch circuit 700 for a final global word lines switch of a switching architecture according to an embodiment is schematically shown in FIG. 7A.

The high voltage switch circuit 700 may include a first depletion NMOS transistor MND1 and a second depletion NMOS transistor MND2 parallel inserted between with the positive voltage supply VSUPPLY_P and a first internal node INT. The first depletion NMOS transistor MND1 may have a control or gate terminal connected to the output terminal OUT of the high voltage switch circuit 700 and the second depletion NMOS transistor MND2 may have a control or gate terminal to receive a first shifted enabling signal EN_LS1.

The high voltage switch circuit 700 further may include a PMOS transistor MP1 inserted between the first internal node INT and the output terminal OUT, and may have a control or gate terminal to receive a second shifted enabling signal EN_LS1b as well as an NMOS transistor MN1 that is inserted between a second internal node CASC_NODE and the negative voltage supply VSUPPLY_N and may have a control or gate terminal receiving a third shifted enabling signal EN_LS2b.

Suitably, the high voltage switch circuit 700 also may include a cascode block 710 inserted between the output terminal OUT and the second internal node CASC_NODE, the cascode block 710 including a further NMOS transistor MCASC inserted between the output terminal OUT and the second internal node CASC_NODE and may have a control or gate terminal receiving the second shifted enabling signal EN_LS1b. The further NMOS transistor MCASC also may have a bulk terminal connected to the negative voltage supply VSUPPLY_N.

In this way, the further NMOS transistor MCASC may be inserted between the output terminal OUT and a drain terminal of the NMOS transistor MN1 which is connected to the second internal node CASC_NODE.

Suitably, the further NMOS transistor MCASC may be a high-voltage triple-well NMOS transistor, having a gate terminal to receive the second shifted enabling signal EN_LS1b, a drain terminal connected to the output terminal OUT, a source terminal connected to the second internal node CASC_NODE and a bulk terminal connected to the negative voltage supply VSUPPLY_N.

Figure 7B:
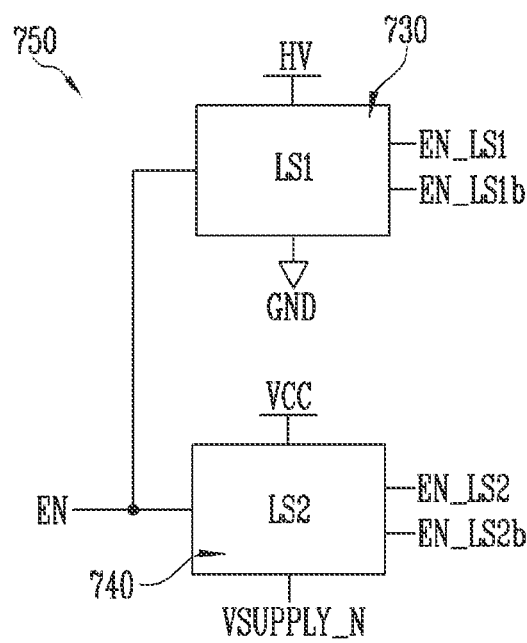

As schematically indicated in FIG. 7B, the shifted enabling signals EN_LS1, EN_LS1b and EN_LS2b may be set by a level shifter group 750.

More particularly, the level shifter group 750 may include a first block 730 including a first level shifter LS1, to receive an enabling signal EN and to provide the first and second shifted enabling signals EN_LS1, EN_LS1b alternatively toggled between a high voltage HV and ground GND. The level shifter group 750 may also include a second block 740 that includes a second level shifter LS2, to receive the enabling signal EN and to provide the third shifted enabling signal EN_LS2b as well as a further shifted enabling signal EN_LS2 alternatively toggled between a supply voltage VCC and the negative voltage supply VSUPPLY_N.

In this way, when the negative voltage supply VSUPPLY_N is to be provided to the final global word lines switches, a negative voltage is used to inhibit a discharge path by means of the second block 740 which toggles the third shifted enabling signal EN_LS2b on the basis of the voltage value of the enabling signal EN according to the following rules:

$EN=VCC \rightarrow EN\_LS2b=VSUPPLY\_N$ $EN=0 \rightarrow EN\_LS2b=VCC$

Moreover, in order to improve the time response of the high voltage switch circuit 700, the first block 730 may be used to drive the charge path with high voltage signals still on the basis of the voltage value of the enabling signal EN according to the following rules:

$EN=VCC$:

$EN\_LS1=HV$ $EN\_LS1b=0$ $EN=0$:

$EN\_LS1=0$ $EN\_LS1b=HV$ being $HV>VCC$.

In this way, when the enabling signal EN goes high, the second depletion NMOS transistor MND2 is driven at the high voltage HV and the first internal node INT is pre-charged high. On the contrary, when the enabling signal EN goes down, the PMOS transistor MP1 is turned off faster since it has the high voltage HV applied at its gate terminal.

Moreover, as indicated above, the gate terminal of the PMOS transistor MP1 is connected to the second shifted enabling signal EN_LS1b. Further, the gate terminal of the second depletion NMOS transistor MND2 may be connected to the first shifted enabling signal EN_LS1. Thus, both enabling signals may be provided by the first block 730 of the level shifter group 750, which may include the first level shifter LS1 being a positive level shifter toggling between the high voltage HV and ground GND.

Suitably, the output terminal of the second block 740 is not directly capacitively coupled to the output terminal OUT, because the output terminal of the second block 740 includes the second level shifter LS2 being a negative level shifter since the second block 740 toggles between the supply voltage value VCC and the negative voltage supply VSUPPLY_N.

This allows protection of the output terminal of the second block 740 against switching disturbances on the output terminal OUT of the high voltage switch circuit 700.

More particularly, it can be verified that, during a Low→High commutation, considering a first enabling signal EN varying between 0 (ground) and, for instance, VCC=1.8V, the signals toggle as follows:

The first shifted enabling signal EN_LS1 changes from 0 to HV (being, for instance, 4V) causing the second depletion NMOS transistor MND2 to turn on.

The second shifted enabling signal EN_LS1b changes from HV (4V) to 0 causing the PMOS transistor MP1 to turn on and the further NMOS transistor MCASC to turn off.

The second shifted enabling signal EN_LS1b changes from VCC (1.8V) to VSUPPLY_N (being, for instance, −1V) causing the NMOS transistor MN1 to turn off.

Under these conditions the internal node INT and the output terminal OUT rise to the positive voltage supply VSUPPLY_P (being for instance 20V).

The output terminal OUT of the high voltage switch circuit 700 exerts a capacitive disturbance on the second shifted enabling signal EN_LS1b through a parasitic drain-gate capacitance across the further NMOS transistor MCASC, such disturbance being well tolerated by the positive level shifter LS1 of the first block 730.

In fact, the positive level shifter LS1 of the first block 730 is connected to the ground GND, which is better suited to tolerate bouncing than the negative voltage supply VSUPPLY_N that is connected to the second level shifter LS2 of the second block 740.

Figure 7C:
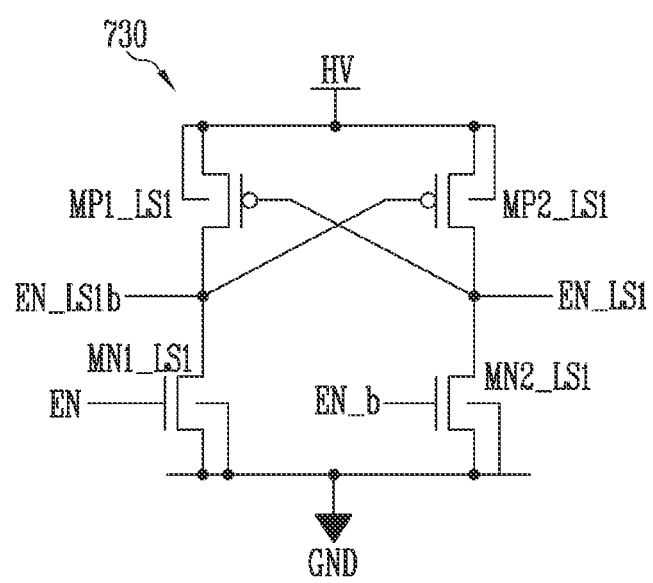
FIGS. 7C, 7D and 7E show a positive level shifter and a negative level shifter, as well as a logic gate connected thereto, respectively, according to an embodiment.
Figure 7D:
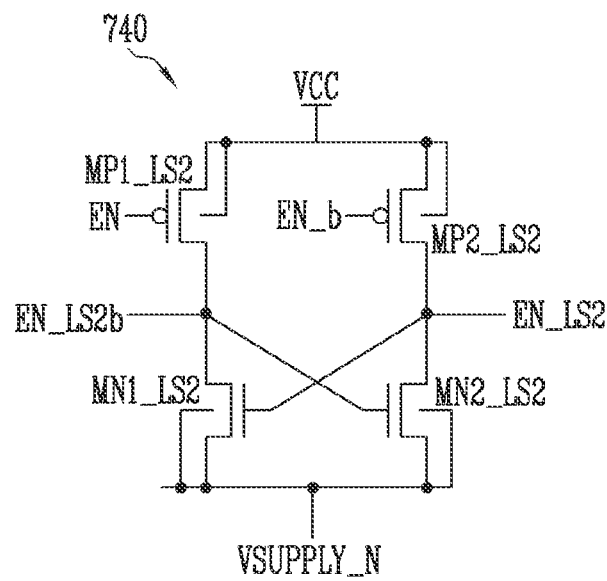

Embodiments of the first level shifter LS1 of the first block 730 and of the second level shifter LS2 of the second block 740 are shown in FIGS. 7C and 7D, respectively.

More particularly, as shown in FIG. 7C, the first level shifter LS1 of the first block 730 may include a first NMOS transistor MN1_LS1 that is connected between second shifted enabling signal EN_LS1$b$ and ground GND and having its gate terminal receiving the first enabling signal EN, a second NMOS transistor MN2_LS1 that is connected between first shifted enabling signal EN_LS1 and ground GND and may have its gate terminal receiving an inverted enabling signal EN_b, which is an inverted signal with respect to the first enabling signal EN.

Figure 7E:
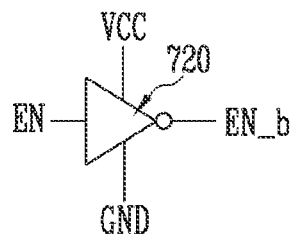

In particular, as schematically indicated in FIG. 7E, the enabling signal EN and the inverted enabling signal EN_b may be set alternatively equal to a supply voltage value VCC and ground GND by a logic gate 720.

First level shifter LS1 of the first block 730 further may include a first PMOS transistor MP1_LS1 that is connected between high voltage HV and second shifted enabling signal EN_LS1$b$ and may have its gate terminal receiving the first shifted enabling signal EN_LS1. The first level shifter LS1 of the first block 730 may also include a second PMOS transistor MP2_LS1 that is connected between high voltage HV and first shifted enabling signal EN_LS1 and may have its gate terminal receiving the second shifted enabling signal EN_LS1$b$.

It should be appreciated that when the signal at the output terminal OUT of the high voltage switch circuit 700 is rising, it exerts a coupling capacitive disturb on the second shifted enabling signal EN_LS1$b$ of first level shifter LS1 of the first block 730. However, it should be noticed that second shifted enabling signal EN_LS1$b$ is pulled to ground GND by the first NMOS transistor MN1_LS1 whose gate receives the first enabling signal EN which is equal to supply voltage value VCC in this condition.

Therefore, the voltage difference Vgs between the gate and source terminal of the first NMOS transistor MN1_LS1 is not affected by capacitive disturbance and the value of the second shifted enabling signal EN_LS1$b$ of first level shifter LS1 of the first block 730 remains firmly at ground GND.

Similarly, as shown in FIG. 7D, the second level shifter LS2 of the second block 740 may include a first NMOS transistor MN1_LS2 that is connected between the third shifted enabling signal EN_LS2$b$ and the negative voltage supply VSUPPLY_N and may have its gate terminal receiving the further shifted enabling signal EN_LS2. The second level shifter LS2 may also include a second NMOS transistor MN2_LS2 connected between further shifted enabling signal EN_LS2 and negative voltage supply VSUPPLY_N and may have its gate terminal receiving the third shifted enabling signal EN_LS2$b$.

Second level shifter LS2 of the second block 740 further may include a first PMOS transistor MP1_LS2 connected between the supply voltage value VCC and the third shifted enabling signal EN_LS2$b$ and may have its gate terminal receiving the first enabling signal EN. The second level shifter LS2 may further include a second PMOS transistor MP2_LS2 that is connected between supply voltage value VCC and further shifted enabling signal EN_LS2 and may have its gate terminal receiving the inverted enabling signal EN_b.

Also, in this case, it should be appreciated that when the signal at the output terminal OUT of the high voltage switch circuit 700 is rising, exerting a coupling capacitive disturbance on the third shifted enabling signal EN_LS2$b$, the voltage difference Vgs between gate and source terminal of the second NMOS transistor MN2_LS2 may increase and second NMOS transistor MN2_LS2 might therefore start to draw current making further shifted enabling signal EN_LS2 decrease. A decrease of further shifted enabling signal EN_LS2 may cause a decrease in the voltage difference Vgs between the gate and the source terminal of the first NMOS transistor MN1_LS2 which may not be able to firmly pull down the third shifted enabling signal EN_LS2$b$ to negative voltage supply VSUPPLY_N.

For this reason, the addition of the further NMOS transistor MCASC of the cascode block 710 is used to obtain a suitable protection of the second level shifter LS2 of the second block 740 against any switch turn on capacitive coupling.

More particularly, the additions may be:
Cpar: a drain to gate parasitic capacitance of the further NMOS transistor MCASC;
Cpar2: a gate to source parasitic capacitance of the further NMOS transistor MCASC; and
Cpar3: a drain to gate parasitic capacitance of the NMOS transistor MN1.

It may be easily verified that a small coupling disturbance through Cpar is unavoidable on the second shifted enabling signal EN_LS1$b$. However, this disturbance may be transmitted to the third shifted enabling signal EN_LS2$b$ only through the series of Cpar2 and Cpar3, being thus greatly reduced with respect to the known solutions, the first (positive) level shifter LS1 of the first block 730 being strong enough to sustain it.

Hence, suitably according to an embodiment, during a Low→High commutation, the NMOS transistor MN1 and the further NMOS transistor MCASC stay off.

It should be remarked that, in the absence of the further NMOS transistor MCASC, during a Low→High commutation, the capacitive disturbance exerted on third shifted enabling signal EN_LS2$b$ may make first NMOS transistor MN1 turn on slightly. Therefore, a current could flow from output terminal OUT to the negative voltage supply VSUPPLY_N and, since the negative voltage supply VSUPPLY_N is connected to several high voltage switch circuits that can toggle at same time, this charge injection could cause a not negligible bouncing of the negative voltage supply VSUPPLY_N.

Bouncing of negative voltage supply VSUPPLY_N further reduces the ability of second level shifter LS2 of the second block 740 to firmly pull down the third shifted enabling signal EN_LS2$b$.

It should be also remarked that a bouncing of negative voltage supply VSUPPLY_N exists also during a High→Low commutation of high voltage switch circuit 700, and it may have an unacceptable effect also in this case.

In particular, during such a High→Low commutation, the second shifted enabling signal EN_LS1$b$ and the third shifted enabling signal EN_LS2$b$ turn respectively to high voltage HV and supply voltage, thus making the NMOS transistors MCASC and MN1 turn on. The output node OUT of the high voltage switch circuit 700 is thus discharged to the negative voltage supply VSUPPLY_N.

In case of simultaneous commutation of a large number of switches, the bouncing on the negative voltage supply VSUPPLY_N may thus be so high as to reduce the voltage difference Vgs between the gate and the source terminal of the NMOS transistor MN1. In such a case the current drawn by the NMOS transistor MN1 decreases and it may not be enough to win the pull-up part of the high voltage switch circuit 700, which is made by the series of the first depletion NMOS transistor MND1 and the PMOS transistor MP1.

Figure 8A:
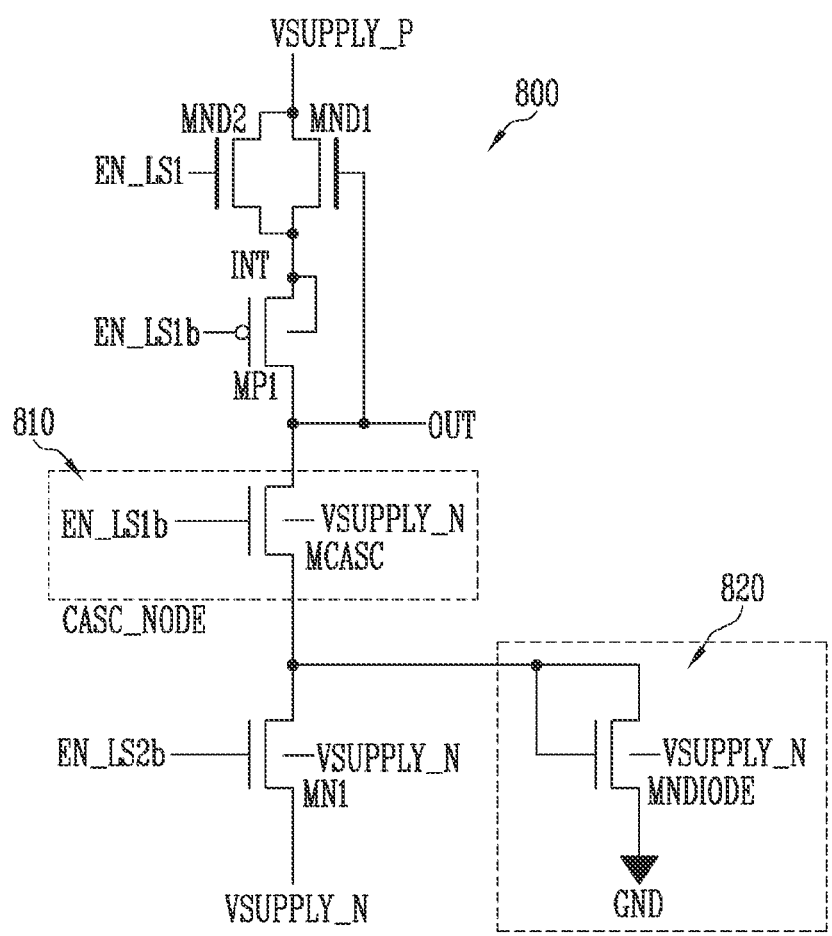
FIGS. 8A and 8B show a high voltage switch circuit according to alternative embodiments.

To reduce the negative voltage supply VSUPPLY_N bouncing during a High→Low transition, according to an alternative embodiment, shown in FIG. 8A, the high voltage switch circuit 800 may include a cascode block 810 inserted between the output terminal OUT and the second internal node CASC_NODE and a stabilization block 820 inserted between the second internal node CASC_NODE and ground GND.

The cascode block 810 may include the further NMOS transistor MCASC inserted between the output terminal OUT and the second internal node CASC_NODE and having a control or gate terminal connected to the second shifted enabling signal EN_LS1*b* and a bulk terminal connected to the negative voltage supply VSUPPLY_N.

The stabilization block 820 may include an additional NMOS transistor MNDIODE inserted between the second internal node CASC_NODE and ground GND. In particular, the additional NMOS transistor MNDIODE may be in diode configuration and have a control or gate terminal connected to the second internal node CASC_NODE and a bulk terminal connected to the negative voltage supply VSUPPLY_N.

Suitably, the stabilization block 820 ensures that only negligible bounce may affect the negative voltage supply VSUPPLY_N during a final part of the discharging of the output terminal OUT of the high voltage switch circuit 800, as explained in the following.

During a High→Low commutation, when the first enabling signal EN changes from VCC (being, for instance, 1.8V) to ground (0V), the signals toggle as follows:

The first shifted enabling signal EN_LS1 changes from HV (being, for instance, 4V) to 0 causing the second depletion NMOS transistor MND2 to turn off.

The second shifted enabling signal EN_LS1*b* changes from 0 to HV (4V) causing the PMOS transistor MP1 to turn off when the internal node INT is discharged down to a sufficiently low level and the further NMOS transistor MCASC turns on. In fact, during an initial phase of a High→Low commutation the PMOS transistor MP1 is still on (even if its control at gate terminal is equal to 4V) and it can eventually turn off only when the internal node INT has discharged below 4V+Vth(MP1), Vth(MP1) being the threshold voltage value of the PMOS transistor MP1.

The third shifted enabling signal EN_LS2*b* changes from VSUPPLY_N (being, for example, −1V) to VCC (1.8V) causing the NMOS transistor MN1 to turn on.

Under these conditions the output terminal OUT starts to discharge through the series of the further NMOS transistor MCASC and the NMOS transistor MN1 and through the series of the further NMOS transistor MCASC and the additional NMOS transistor MNDIODE.

In this case, if the negative voltage supply VSUPPLY_N rises due to an excessive current flowing through the NMOS transistor MN1, causing the NMOS transistor MN1 to tend to turn off and therefore to limit its current, the additional NMOS transistor MNDIODE is not affected by this bouncing of the negative voltage supply VSUPPLY_N because the ground GND node is typically better suited to drain large amount of current and the discharge of the output terminal OUT may continue through the path including the further NMOS transistor MCASC and the additional NMOS transistor MNDIODE.

It is underlined that, when a current is flowing through the additional NMOS transistor MNDIODE, the second internal node CASC_NODE is slightly higher than a threshold voltage of this additional NMOS transistor MNDIODE (equal to ~1V).

After the output terminal OUT is discharged down to around the second internal node CASC_NODE level (~1V), the additional NMOS transistor MNDIODE turns off. A final part of the discharge of the output terminal OUT is made though the series of the further NMOS transistor MCASC and the NMOS transistor MN1.

It is pointed out that this final part of the discharge of the output terminal OUT is suitably achieved according to the embodiment with a much smaller amount of current since, when the output terminal OUT reaches ~1V, the series of the first depletion NMOS transistor MND1 and the PMOS transistor MP1 is turned off.

Therefore, thanks to the stabilization block 820 and to the additional NMOS transistor MNDIODE included therein, only negligible bounce may affect the negative voltage supply VSUPPLY_N during the final part of the discharge of the output terminal OUT of the high voltage switch circuit 800.

The additional NMOS transistor MNDIODE is a low voltage NMOS, suitably shielded by the further NMOS transistor MCASC.

Figure 8B:
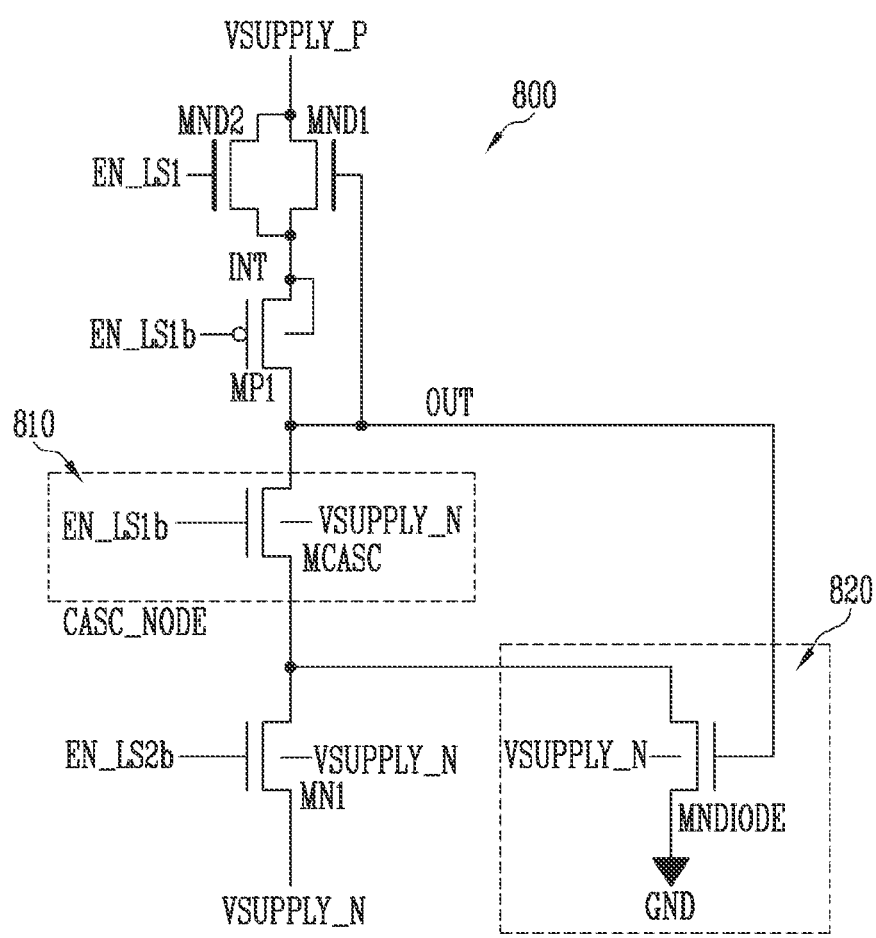

According to a further alternative embodiment, shown in FIG. 8B, the additional NMOS transistor MNDIODE has a gate terminal connected to the output terminal OUT. Since the stabilization block 820 is thus connected to the output terminal OUT and to the second internal node CASC_NODE, the bouncing of the negative voltage supply VSUPPLY_N is further reduced.

As previously, during a High→Low commutation, when the first enabling signal EN changes from VCC (being, for instance, 1.8V) to ground (0V), the signals toggle as follows:

The first shifted enabling signal EN_LS1 changes from HV (being, for instance, 4V) to 0 causing the second depletion NMOS transistor MND2 to turn off.

The second shifted enabling signal EN_LS1*b* changes from 0 to HV (4V) causing the PMOS transistor MP1 to turn off when the internal node INT is discharged down to a sufficiently low level and the further NMOS transistor MCASC to turn on. In fact, as previously indicated, during an initial phase of a High→Low commutation the PMOS transistor MP1 is still on (even if its control at gate terminal is equal to 4V) and it can eventually turn off only when the internal node INT has discharged below 4V+Vth(MP1), Vth(MP1) being the threshold voltage value of the PMOS transistor MP1.

The third shifted enabling signal EN_LS2*b* changes from VSUPPLY_N (being, for example, −1V) to VCC (1.8V) causing the NMOS transistor MN1 to turn on.

Under these conditions the output terminal OUT starts to discharge though the series of the further NMOS transistor MCASC and the NMOS transistor MN1 and through the series of the further NMOS transistor MCASC and the additional NMOS transistor MNDIODE.

Since the additional NMOS transistor MNDIODE works in the linear region, having the gate-source voltage equal to the voltage value at the output terminal OUT, the second internal node CASC_NODE is suitably slightly higher than ground GND, the on resistance of the additional NMOS transistor MNDIODE being very low.

In this way, when the output terminal OUT goes below a threshold voltage of the additional NMOS transistor MNDIODE, the latter turns off and the discharge of the output terminal OUT is made only through the series of the further NMOS transistor MCASC and the NMOS transistor MN1.

The additional NMOS transistor MNDIODE is a high voltage NMOS, so it has a very high gate-source voltage.

The high voltage switch circuit according to the embodiments are thus able to achieve positive to negative voltage switching with reduced coupling and reduced bouncing.

Suitably, the high voltage switch circuit is able to correctly work in the case of many high voltage switch circuits toggling simultaneously, reducing the negative voltage supply bouncing.

Moreover, the high voltage switch circuit avoids the parasitic coupling that may disturb a negative level shifter included in the logic connected thereto.

Finally, the high voltage switch circuits according to the embodiments show an effectively reduced total area due to the reduction of the number of the input voltages of the final switches from three to two, negative voltages being passed to an output line for selected word lines along with positive voltage according to needs before being passed to the final switches.

In an embodiment of the present disclosure, a switching architecture for providing a global word line switch with a reduced area, includes a voltage generation circuit for generating a first positive voltage, a second positive voltage, and a negative voltage, respectively; a first switching circuit for switching the first positive voltage to a plurality of global word line switches; and a second switching circuit, configured as a single circuit, for switching the second positive voltage or the negative voltage to the plurality of global word switches.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A switching architecture for providing input voltage signals from input voltage lines to a plurality of global word lines connected to a memory device, the switching architecture comprising:
 a first switching block receiving a first set of positive voltages used to bias unselected word lines and being connected to a first output line providing a first output bias voltage;
 a second switching block receiving a second set of positive voltages and a third set of negative voltages used to bias selected word lines and being connected to a second output line providing a second output bias voltage; and
 a plurality of final switches being input connected to the first and second output lines and output connected to a respective global word line.

2. The switching architecture of claim 1 wherein the second switching block comprises high voltage switch circuits able to manage positive and negative voltage values to be provided to the second output line.

3. The switching architecture of claim 1, wherein each final switch comprises a plurality of high voltage switch circuits being inserted between a positive voltage supply and a negative voltage supply and having an input terminal receiving an enabling signal and an output terminal connected to a respective pass transistor, in turn connected to a global word line.

4. The switching architecture of claim 3, wherein each final switch comprises:
 a first high voltage switch circuit inserted between the positive voltage supply and the negative voltage supply and having a first input terminal receiving a first enabling signal and a first output terminal connected to the control terminal of a first pass transistor;
 a second high voltage switch circuit inserted between the positive voltage supply and the negative voltage supply and having a second input terminal receiving a second enabling signal and a second output terminal connected to the control terminal of a second pass transistor; and
 the first pass transistor being inserted between the first selection line receiving the first selection voltage and an output terminal of the final switch connected to the global word line and the second pass transistor being inserted between the second selection line receiving the second selection voltage and the output terminal of the final switch connected to the global word line.

5. The switching architecture of claim 4, wherein the first pass transistor and second pass transistor are triple well NMOS transistors having bulk terminals connected to the negative voltage supply.

6. The switching architecture of claim 4, further comprising a selection block providing the negative voltage supply to the first and second high voltage switch circuits.

7. The switching architecture of claim 6, wherein the selection block further comprises:
 a third high voltage switch circuit inserted between the positive voltage supply and a negative voltage and having a third input terminal receiving a third enabling signal and a third output terminal connected to the control terminal of a third pass transistor; and
 a fourth high voltage switch circuit inserted between the positive voltage supply and the negative voltage and having a fourth input terminal receiving a fourth enabling signal and a fourth output terminal connected to the control terminal of a fourth pass transistor,
 the third pass transistor being inserted between ground and the negative voltage supply and the fourth pass transistor M4 being inserted between the negative voltage and the negative voltage supply.

8. The switching architecture of claim 7, wherein the third and fourth additional enabling signals are set alternatively equal to a supply voltage value and ground.

9. The switching architecture of claim 3, wherein each high voltage switch circuit comprises:
 a first depletion NMOS transistor and a second depletion NMOS transistor parallel inserted between the positive voltage supply and a first internal node, the first depletion NMOS transistor having a control terminal connected to the output terminal of the high voltage switch circuit and the second depletion NMOS transistor having a control terminal receiving a first shifted enabling signal;
 a PMOS transistor inserted between the first internal node and the output terminal and having a control terminal receiving a second shifted enabling signal;
 an NMOS transistor inserted between a second internal node and the negative voltage supply and having a control terminal receiving a third shifted enabling signal; and a cascode block inserted between the output terminal and the second internal node and comprising a further NMOS transistor inserted between the output terminal and the second internal node and having a control terminal receiving the second shifted enabling signal and a bulk terminal connected to the negative voltage supply.

10. The switching architecture of claim 9, wherein the further NMOS transistor MCASC is a high-voltage triple-well NMOS transistor.

11. The switching architecture of claim 9, wherein the first, second and third shifted enabling signals are set by a logic comprising:
a first block including a first level shifter, receiving an enabling signal and providing the first and second shifted enabling signals alternatively toggled between a high voltage and ground; and
a second block including a second level shifter, receiving the enabling signal and providing the third shifted enabling signal as well as a further shifted enabling signal alternatively toggled between a supply voltage and the negative voltage supply.

12. The switching architecture of claim 9, wherein the high voltage switch circuit further comprises a stabilization block inserted between the second internal node and ground and comprising an additional NMOS transistor inserted between the second internal node and ground.

13. The switching architecture of claim 12, wherein the additional NMOS transistor is diode connected and has a control terminal connected to the second internal node and a bulk terminal connected to the negative voltage supply.

14. The switching architecture of claim 13, wherein the additional NMOS transistor is a low voltage triple-well NMOS transistor.

15. The switching architecture of claim 12, wherein the additional NMOS transistor has a control terminal connected to the output terminal and a bulk terminal connected to the negative voltage supply.

16. The switching architecture of claim 15, wherein the additional NMOS transistor is a high voltage triple-well NMOS transistor.

17. A high voltage switch circuit for a final switch of a switching architecture for providing input voltage signals from input voltage lines to a plurality of global word lines connected to a memory device, the high voltage switch circuit being inserted between a positive voltage supply and a negative voltage supply and comprising:
a first depletion NMOS transistor and a second depletion NMOS transistor parallel inserted between the positive voltage supply and a first internal node, the first depletion NMOS transistor having a control terminal connected to the output terminal of the high voltage switch circuit and the second depletion NMOS transistor having a control terminal receiving a first shifted enabling signal;
a PMOS transistor inserted between the first internal node and the output terminal and having a control terminal receiving a second shifted enabling signal;
an NMOS transistor inserted between a second internal node and the negative voltage supply and having a control terminal receiving a third shifted enabling signal; and
a cascode block inserted between the output terminal and the second internal node and comprising a further NMOS transistor inserted between the output terminal and the second internal node and having a control terminal receiving the second shifted enabling signal and a bulk terminal connected to the negative voltage supply.

18. The high voltage switch circuit of claim 17, further comprising a stabilization block inserted between the second internal node and ground and comprising an additional NMOS transistor inserted between the second internal node and ground.

19. The high voltage switch circuit of claim 18, wherein the additional NMOS transistor is diode connected and has a control terminal connected to the second internal node and a bulk terminal connected to the negative voltage supply.

20. The high voltage switch circuit of claim 18, wherein the additional NMOS transistor has a control terminal connected to the output terminal and a bulk terminal connected to the negative voltage supply.

* * * * *